(12) United States Patent
Hsieh et al.

(10) Patent No.: US 7,126,219 B2
(45) Date of Patent: Oct. 24, 2006

(54) SMALL MEMORY CARD

(75) Inventors: Jackson Hsieh, Hsinchu Hsien (TW); Jichen Wu, Hsinchu Hsien (TW); Worrell Tsai, Hsinchu Hsien (TW); Bruce Chen, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/683,837

(22) Filed: Oct. 9, 2003

(65) Prior Publication Data
US 2005/0077607 A1    Apr. 14, 2005

(51) Int. Cl.
*H01L 23/02* (2006.01)
(52) U.S. Cl. .................. 257/723; 257/679; 257/784
(58) Field of Classification Search ............. 257/784, 257/723, 679
See application file for complete search history.

(56) References Cited

U.S. PATENT DOCUMENTS 6,573,567 B1 * 6/2003 Nishizawa et al. ......... 257/358
6,707,141 B1 * 3/2004 Akram ...................... 257/686

* cited by examiner

*Primary Examiner*—Roy Potter

(57) ABSTRACT

A small memory card includes a substrate, a plurality of memory chips, a plurality of wires, and a glue layer, the substrate is formed with a plurality of through slots of the substrate, then the plurality of memory chips are mounted on the substrate, so that the plurality of bounding pads of the memory chip are exposed from through slot, the plurality of wires are electrically connected to the substrate, the glue layer is encapsulated the plurality of memory chips at the same time. Thus, the small memory card of present invention has small packed volume, and the manufacturing processes may be convenient.

3 Claims, 2 Drawing Sheets

SMALL MEMORY CARD

BACKGROUND OF THE INVENTION

The present invention relates to a small memory card, and in particular to the volume of a small memory card which may be reduced advantageously.

DESCRIPTION OF THE RELATED ART

The prior method for producing a general memory card always packs chips to single integrated circuits, then mounts the IC onto a printed circuit board by the way of surface mount technique (SMT). The chip may be a memory element, such as flash memory. The golden fingers mounted on the printed circuit board for inserting into a slot of a computer main-board. In addition to some passive elements such as resistance, capacitor and inductor are mounted on the memory card.

Referring to FIG. 1 showing the schematic illustrates of a prior memory card, the golden finger 15 is used to insert into a slot of a computer main-board, there are active elements and passive elements on the module card, the active elements usually are packed to an integrated circuit 11. Each integrated circuit 11 encapsulates a chip 12, which may be a memory chip, for example a flash memory chip. The pins 13 of integrated circuit 11 are mounted on the printed circuit board 14 of the memory card by SMT, the printed circuit board 14 has solder points 17 connected to pins 13. The prior arts has the following disadvantages:

1. A chip 12 must be packed then mounted on the circuit board 14, so more steps is unnecessary leads to the cost in manufacturing and packing will be increased.
2. A memory card always includes many ICs so that the integrated circuit 11 must be mounted on the PCB 14 one by one during manufacturing the module card.
3. The cost of SMT is expensive. Special manufacture devices such as a SMT machine and a solder furnace will extra the cost of equipment.
4. The chip 12 of a small memory card is packed in conventional, so that the volume of a small memory card may not be reduced advantageously.

SUMMARY OF THE INVENTION

The object of the present invention is to provide a small memory card may be manufactured conveniently, the manufacturing processes may be simplified and the manufacturing cost may decrease.

Another object of the present invention is to provide a small memory card with lessen packed size to achieve minimizing the volume of a small memory card advantageously.

To achieve the above-mentioned object, the present invention includes a substrate, a plurality of memory chips, a plurality of wires, and a glue layer. The substrate is formed with a plurality of through slots, and a plurality of golden fingers formed on the side of the substrate, the substrate is used to arranged in an electric device, so that, the golden fingers may be connected to the electric device. The plural of memory chips are mounted on the substrate, thus the plurality of bounding pads are exposed from the through slots. The plurality of wires, which are arranged in the through slots, electrically connected the bounding pads of the memory chips to the substrate. And the glue layer is filled within the through slot of the substrate to protect the plurality of wires and to encapsulate the plurality of memory chips at the same time.

According to one aspect of the present invention, the heat from the memory chip may be traveled via the disperse heat slice. Therefore, proving the durability and dependability of small memory card.

DETAILED DESCRIPTION OF THE INVENTION

Figure 1:
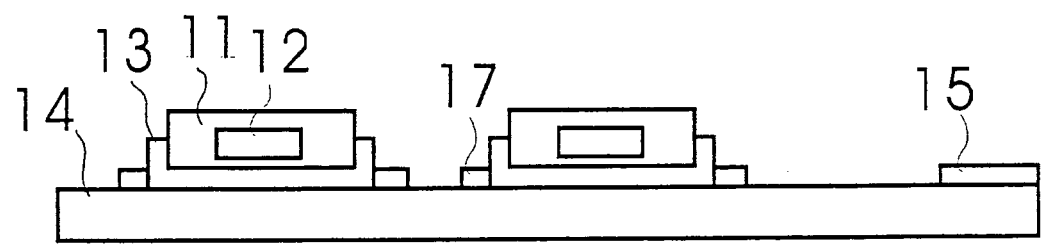
FIG. 1 is a schematic illustrates showing a conventional small memory card structure.
Figure 2:
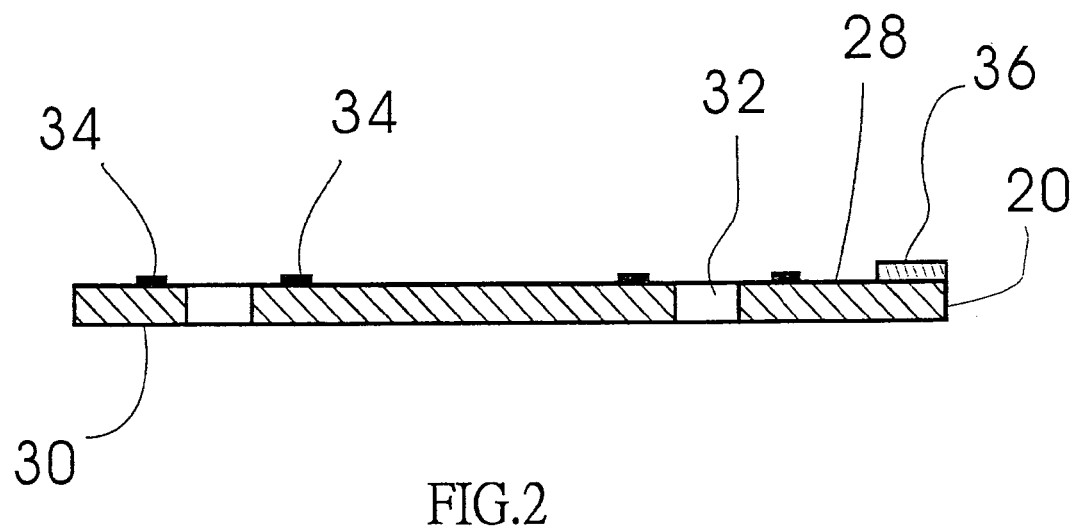
FIG. 2 is the first schematic illustrates showing a small memory card structure with the present invention.
Figure 3:
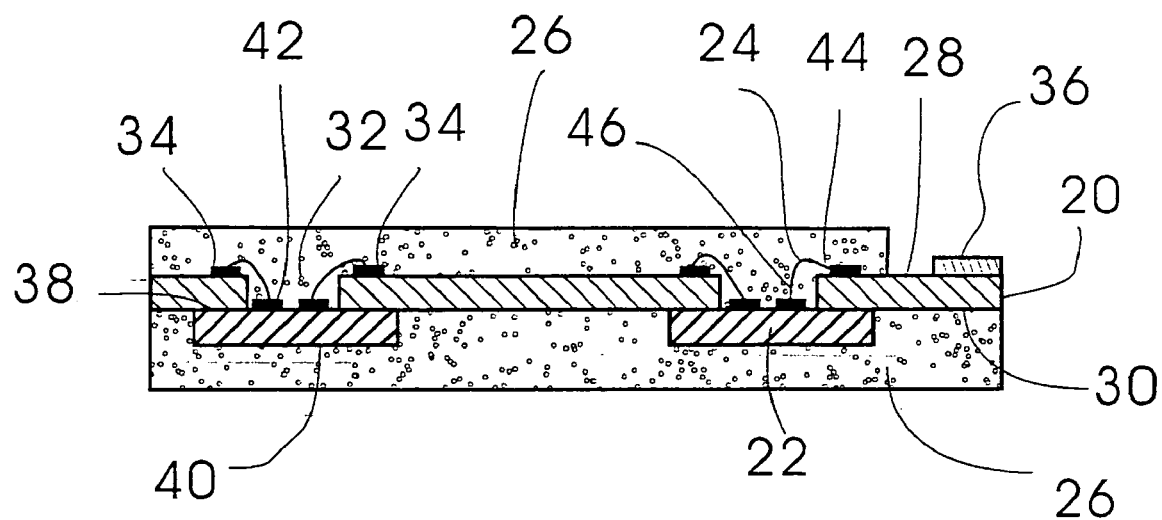
FIG. 3 is the second schematic illustrates showing the small memory card structure with the present invention.

FIG. 2 and FIG. 3 are showing the schematic illustrates of a small memory card of the present invention, which include a substrate 20, a plurality of memory chips 22, a plurality of wires 24 and a glue layer 26.

The substrate 20 has an upper surface 28, a lower surface 30, and a plurality of through slots 32 penetrating through the substrate from the upper surface 28 to lower surface 30. The edge of every through slots 32 of the upper surface 28 are formed with a plurality of connected points 34 and a plurality of golden fingers 36 connected to the connected points, the substrate 20 is used to arranged in an electric device, so that the golden fingers 36 may be electrically connected to the electric device.

The plurality of memory chips 22 have an upper surface 38 and a lower surface 40, a plurality of bounding pads 42 are formed on the middle region of the upper surface 38, the upper surface 38 of the memory chips 22 are mounted on the lower surface 30 of the substrate 20, thus, the plurality of bounding pads 42 are exposed from the through slot 32 of the substrate 20.

Each of the wires 24, which is formed with first connected points 44 and second connected points 46, are arranged within the through slot 32 of the substrate 20, the first connected points 44 are electrically connected to the connected point 34 of the substrate 20, the second connected points 46 of the wires 24 are electrically connected to the bounding pads 42 of the memory chip 22.

The glue layer 26 is encapsulated the upper surface 28 of the substrate 20 and filled in every through slots 32, so that the plurality of wires 24 may be protected, also encapsulated the lower surface 30 of the substrate 20 and the plurality of memory chips 22 at the same time.

Figure 4:
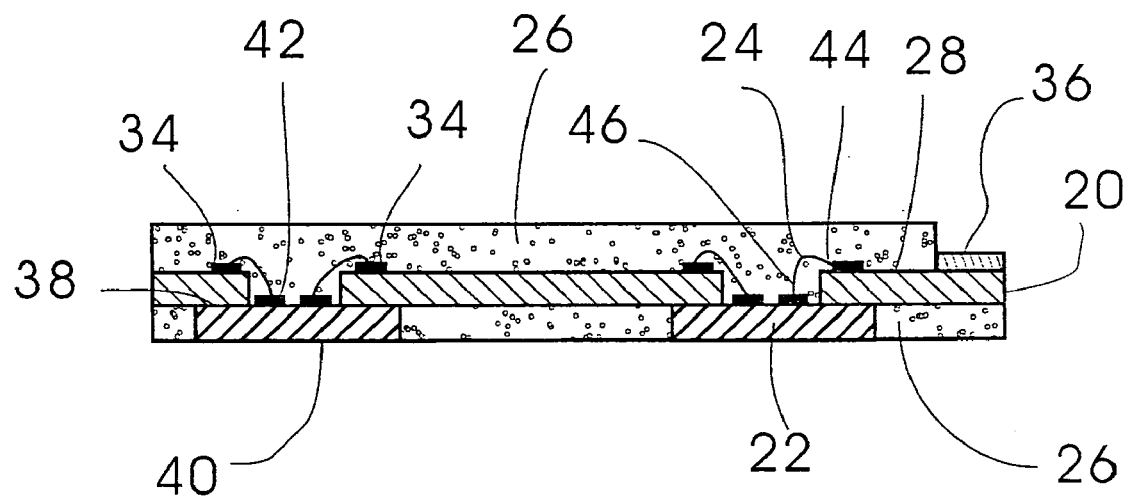
FIG. 4 is another schematic illustrates showing the small memory card structure with the present invention.

Refer to FIG. 4, in the embodiment, the glue layer 26 is encapsulated a plurality of memory chips 22 at the same time, and is revealed the lower surface 40 of a plurality of memory chips 22 from the glue layer 26, thus, the present invention has high function of disperse heat to promote its durability and lifetime effectively.

Therefore, the small memory card of the present invention has the following advantages:

1. Since the plurality of memory chips 22 connect electrically to the packed structure of substrate 20 by center fuse manner to achieve minimizing the volume of a small memory card advantageously.

2. Since the revealed glue layer 26, which encapsulate the lower surface 40 of the plurality of memory chips 22, the heat from the memory chip 22 may can be rapidly spread out, so that, proving the durability and dependability of the small memory card.

3. Since arrange the memory chip 22 on the substrate 20 first, then use glue layer 26 encapsulating a plurality of memory chips 22 at the same time, so as to the manufacturing processes may be simplified and the manufacturing cost may decreased.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A small memory card to be set in an electric device, comprising:

A substrate having an upper surface, a lower surface, and a plurality of through slots penetrating the substrate from the upper surface to the lower surface, the upper surface formed with a plurality of connected points and a plurality of golden fingers to electrically connect to the plurality of connected points, the substrate is used to set in the electric device, so that, the golden finger may be electrically connected to the electric device;

At least a memory chip having an upper surface and a lower surface, the upper surface of the memory chip formed with a plurality of bonding pads, the upper surface of the memory chip being mounted on the lower surface of the substrate, so that, the plurality of bonding pads are exposed from the through hole of the substrate;

a plurality of wires having a first connected point and a second connected point, the wires being arranged within the through slot of the substrate, the first connected point electrically connected to the connected point of the substrate, the second connected point electrically connected to the bounding pad of the memory chip; and A glue layer encapsulated the upper surface of the substrate and filled within the through slot of the substrate to protect the plurality of wires.

2. The small memory card according to claim 1, wherein the substrate is formed with two through slots.

3. The small memory card according to claim 1, wherein the lower surface of the memory chips is exposed from the glue layer.

* * * * *